United States Patent [19]

Yamada et al.

[11] Patent Number: 4,986,215

[45] Date of Patent: Jan. 22, 1991

[54] SUSCEPTOR FOR VAPOR-PHASE GROWTH SYSTEM

[75] Inventors: Takayuki Yamada; Takeshi Kii, both of Saga, Japan

[73] Assignees: Kyushu Electronic Metal Co., Ltd., Saga; Osaka Titanium Co., Ltd., Hyogo, both of Japan

[21] Appl. No.: 401,101

[22] Filed: Sep. 1, 1989

[30] Foreign Application Priority Data

Sep. 1, 1988 [JP] Japan .................. 63-219277

[51] Int. Cl.$^5$ .................................. C23C 16/00
[52] U.S. Cl. ...................... 118/728; 118/725; 118/730
[58] Field of Search ............ 118/725, 728, 730; 156/345; 204/298

[56] References Cited

U.S. PATENT DOCUMENTS 3,641,974  2/1972  Yamada et al. ............... 118/725

FOREIGN PATENT DOCUMENTS 59-50095   3/1984  Japan .
61-222221 10/1986  Japan ....................... 118/728
62-4315    1/1987  Japan ....................... 118/725

OTHER PUBLICATIONS

Kren, J. G., "Technique to Deposit Thick Films Without Warping or Breaking Wafer," IBM Technical Disclosure Bulletin, vol. 7, No. 12 (May 1965) p. 1119.

Primary Examiner—Stanley Silverman
Assistant Examiner—Terry J. Owens
Attorney, Agent, or Firm—A. W. Breiner

[57] ABSTRACT

A susceptor for use in a vertical vapor-phase growth system designed to heat substrates by means of heat transferred and radiated from a susceptor heated to cause vapor-phase growth on the substrates. The susceptor has a large number of spot-faced portions for receiving substrates, respectively. Each spot-faced portion has a concentrical circular ridge to define a pair of inner and outer spaces at the inner and outer sides, respectively, of the ridge, each of the inner and outer spaces having a concave bottom having a circular radial section, so that a substrate is supported by the circular ridge. Thus, the substrate is uniformly heated by means of the RF induction heat from the susceptor, so that generation of a thermal stress exceeding the critical strength of the substrate is suppressed and substantially no slip occurs. Since silicon that is formed during a vapor-phase growth reaction is deposited on the bottom of the outer space, it is possible to prevent deposition of silicon on the periphery of the reverse side of the substrate.

4 Claims, 4 Drawing Sheets

Fig. 1
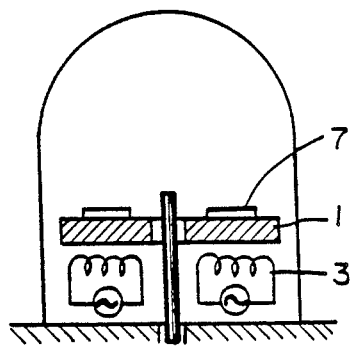
Fig. 2
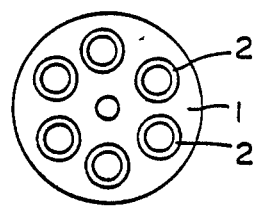
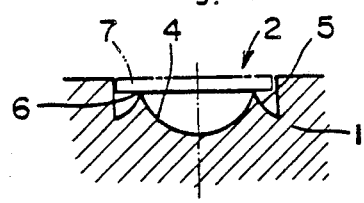
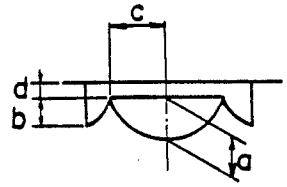

SUSCEPTOR FOR VAPOR-PHASE GROWTH SYSTEM

BACKGROUND OF THE INVENTION

1. Field of the Invention

The present invention relates to an improvement in a susceptor used in a vertical vapor-phase growth system to support and heat substrates which are to be subjected to vapor-phase growth.

2. Description of the Prior Art

As shown in FIG. 1, a reactor used for epitaxial growth includes three elements;
(1) susceptor 1 to hold substrates 7,
(2) reaction chamber,
(3) heating means 3.

Several types of epitaxial reactors having various elements are used—for example, horizontal type, vertical type, barrel type.

In a vertical-type reactor, as shown in FIG. 1, a radio-frequency (RF) induction heater 3 and a susceptor 1 made of electro-conductive material, generally carbon graphite, are used. As shown in FIG. 7, susceptor 1-2 has a number of spot-faced portions 2—2 provided in the surface thereof to receive substrates, respectively, which are to be subjected to vapor-phase growth.

The substrates mounted on each susceptor 1-2 are heated by means of heat transferred and radiated from the susceptor 1-2. The spot-faced portions 2—2 for receiving respective substrates have heretofore been formed so as to have a bottom with a V-shaped cross-sectional configuration (see FIG. 8A), a flat bottom (see FIG. 8B), a bottom constituted by a single curved surface (see FIG. 8C), etc. (for example, see Japanese Patent Application Laid-Open Publication (KOKAI) Nos. 59-50095 and 62-4315).

When a substrate received in a spot-face portion in a susceptor is heated at high temperature, a thermal stress which exceeds the critical strength of the substrate is generated therein and slip, that is, a displacement of crystal planes, occurs. The slip is related to the cross-sectional configuration of the spot-faced portions and, therefore, various considerations have heretofore been given to improve the configuration of the spot-faced portions (for example, see Japanese Patent Application Laid-Open Publication (KOKAI) Nos. 59-50095 and 62-4315). There is also a known method wherein generation of slip is prevented by controlling the radial temperature gradient in each substrate and temperature variations within the plane (for example, see Japanese Patent Application Laid-Open Publication (KOKAI) No. 61-190921).

Thus, the improvements hitherto made in susceptors for vapor-phase growth systems aim mainly at preventing generation of slip in substrates.

Accordingly, in a continuous vapor-phase epitaxial growth reaction, silicon is deposited on the periphery of the reverse side of each substrate and this leads to problems in the device process, for example, damage to the mask during lithography process and peel off of chips during dicing process, which results in a lowering in the product yield.

SUMMARY OF THE INVENTION

In view of the above-described problems of the prior art, it is a primary object of the present invention to provide a susceptor for supporting substrates to be subjected to vapor-phase growth which is designed so that it is possible to eliminate the deposition of silicon on the periphery of the reverse side of each substrate and also possible to reduce the incidence of slip.

To this end, the present invention provides a susceptor for a vapor-phase growth system comprising: a spot-faced portion provided therein for mounting a substrate, the spot-faced portion having a concentrical circular ridge to define a pair of inner and outer spaces at the inner and outer sides, respectively, of the ridge, each of the inner and outer spaces having a concave bottom having a circular radial section, so that a substrate is supported by the circular ridge.

It is most effective to provide the circular ridge at a position corresponding to 0.6 to 0.9 times the radius of the substrate.

It is necessary in order to minimize the incidence of slip to form the spot-faced portion such that the depth of the concave bottom of the inner space from the substrate supporting plane is in the range of from $25\mu m$ to $150\ \mu m$ and the depth of the concave bottom of the outer space from the substrate supporting plane is in the range of from $30\ \mu m$ to $70\ \mu m$.

Thus, according to the present invention, a substrate is supported by means of a circular ridge formed in each spot-faced portion and heated through the susceptor and it is therefore possible to heat the substrate uniformly by means of the radiant heat from the susceptor. Thus, generation of a thermal stress exceeding the critical strength of the substrate is suppressed and substantially no slip occurs.

Since the spot-faced portion has an outer space, silicon that is formed during a vapor-phase growth reaction is deposited on the bottom of the outer space, thus preventing deposition of silicon on the periphery of the reverse side of the substrate.

BRIEF DESCRIPTION OF THE DRAWINGS

The above and other objects, features and advantages of the present invention will become more apparent from the following description of the preferred embodiment thereof, taken in conjunction with the accompanying drawings, in which like reference numerals denote like elements, and of which:

FIG. 1 shows an essential part of a vertical vapor-phase growth system;

FIG. 2 is a plan view of one embodiment of the susceptor according to the present invention;

FIG. 3A is an enlarged sectional view of one spot-faced portion shown in FIG. 2;

FIG. 3B shows principal dimensions of the spot-faced portion;

DESCRIPTION OF THE PREFERRED EMBODIMENT

Figure 4A:
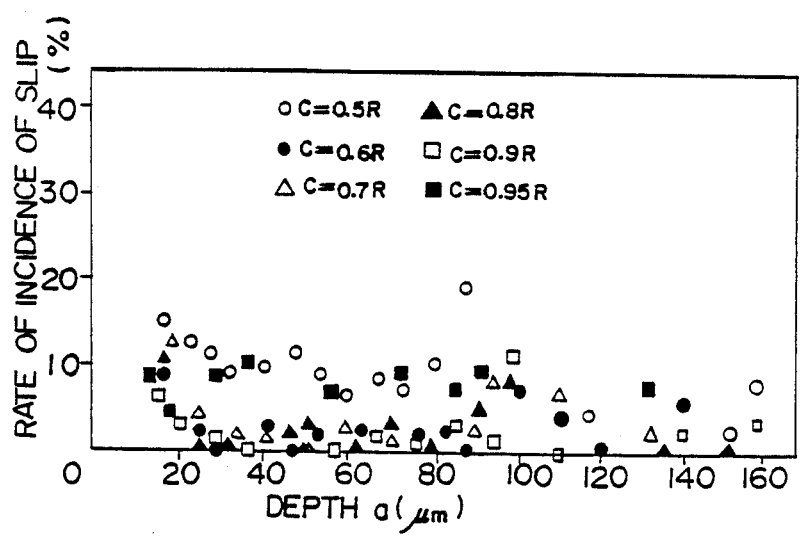
FIG. 4A is a graph showing the rate of incidence of slip obtained in an experiment conducted with the radius of the circular ridge provided in the spot-faced portion being varied and the depth of the inner space defined by the ridge being changed for each value for the radius.

The present invention will be described below in detail with reference to the accompanying drawings.

FIG. 1 shows an ordinary vertical vapor-phase growth system wherein substrates 7 which are to be subjected to vapor-phase growth are placed on each of the rotating graphite susceptors 1 and heated by means of high-frequency induction heaters 3 installed under the susceptors 1, thereby performing a vapor-phase growth reaction The susceptors 1 are arranged as shown in FIGS. 2 and 3.

More specifically, each of a multiplicity of spot-faced portions 2 that are disposed on the surface of each susceptor 1 has a concentrical circular edge 6 which defines a pair of inner and outer spaces 4 and 5 at the inner and outer sides, respectively, of it, each of the inner and outer spaces 4 and 5 having a concave bottom with a circular radial section, so that a substrate 7 is supported by the circular ridge 6.

The substrate 7 is separate from the susceptor 1 except that it is in line contact with the circular edge 6, and heating of the substrate 7 is therefore conducted mainly by radiant heat. Accordingly, the substrate 7 is heated substantially uniformly at the reverse side thereof and in the radial direction, so that the temperature gradient is relatively small and thermal stress is not readily generated.

A silicon substrate having a diameter of 150 mm and a thickness of 680 $\mu$m was subjected to vapor-phase epitaxy on the susceptor 1 shown in FIGS. 2 and 3 with the radius C of the inner space 4 being varied, i.e., 0.5R, 0.6R, 0.7R, 0.8R, 0.9R and 0.95R (R: the radius of the substrate), and the depth a of the inner space 4 being changed for each value for the radius C to measure the rate of incidence of slip for each set of conditions. The results are shown in FIG. 4A.

Figure 4B:
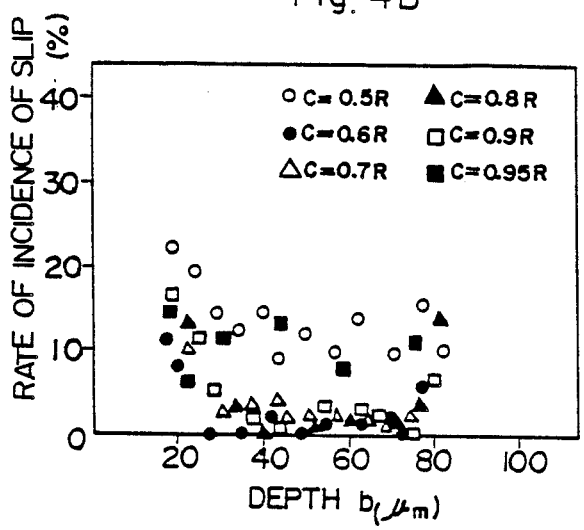
FIG. 4B is a graph showing the rate of incidence of slip obtained in an experiment conducted with the radius of the circular ridge provided in the spot-faced portion being varied and the depth of the outer space defined by the ridge being changed for each value for the radius.

A similar experiment was conducted with the radius C being varied in the same way as the above and the depth b of the outer space 5 being changed for each value for the radius C to measure the rate of incidence of slip for each set of conditions. The results are shown in FIG. 4B.

It will be clear from the results shown in these graphs that the rate of incidence of slip is low when the radius C of the inner space 4 is in the range of from 0.6R to 0.9R and the depth a is in the range of from 25 $\mu$m to 150 $\mu$m and when the depth b of the outer space 5 is in the range of from 30 $\mu$m to 70 $\mu$m.

Next, the susceptor 1 shown in FIGS. 2 and 3 was used to carry out continuous vapor-phase growth reaction for silicon substrates after the susceptor 1 had been cleaned by vapor-phase etching, and the condition of deposition on the periphery of the reverse side of each substrate was examined in comparison with the substrates processed using a conventional susceptor.

Figure 5A:
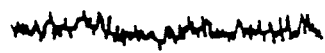
FIG. 5A is a graph showing the roughness of the reverse sides of the peripheries of substrates in the first batch subjected to a vapor-phase growth reaction using the susceptor according to the present invention.
Figure 5B:
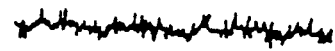
FIG. 5B is a graph showing the roughness of the reverse sides of the peripheries of substrates in the third batch subjected to a vapor phase growth reaction using the susceptor according to the present invention.

The results of the experiment carried out using the susceptor according to the present invention are shown in FIG. 5. FIG. 5A shows the roughness of the reverse sides of substrates in the first batch processed after the susceptor had been cleaned by vapor-phase etching, and FIG. 5B shows those in the third batch processed by continuously carrying out the vapor-phase growth reaction. It will be clear from these figures that there is no difference in the irregularities (i.e., about 0.5 $\mu$m) in the reverse sides between the first and third batches and there is no abnormal growth on the periphery of each substrate even when the vapor-phase growth reaction is carried out continuously.

Figure 6A:
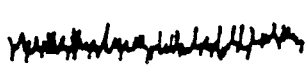
FIG. 6A is a graph showing the roughness of the reverse sides of the peripheries of substrates in the first batch subjected to a vapor-phase growth reaction using a conventional susceptor.
Figure 6B:
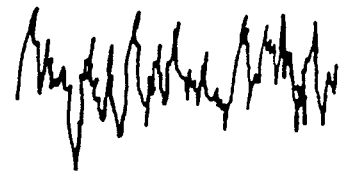
FIG. 6B is a graph showing the roughness of the reverse sides of the peripheries of substrates in the second batch subjected to a vapor-phase growth reaction using the conventional susceptor.
Figure 7:
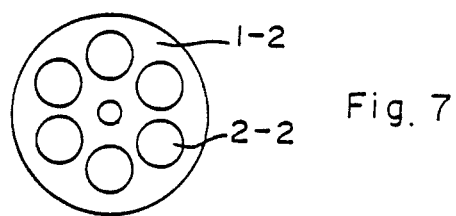
FIG. 7 is a plan view of a conventional susceptor.
Figure 8A:
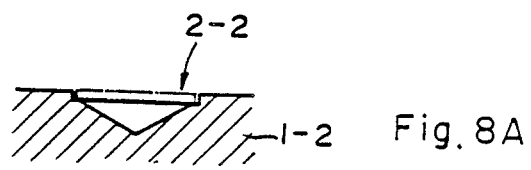
FIG. 8A is a sectional view showing a conventional susceptor provided with spot-faced portions each having a bottom with a V-shaped cross-sectional configuration.
Figure 8B:
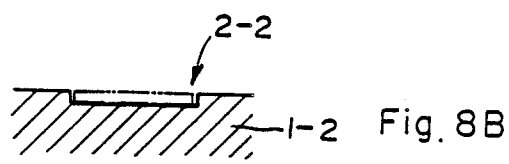
FIG. 8B is a sectional view showing a conventional susceptor provided with spot-faced portions each having a flat bottom.
Figure 8C:
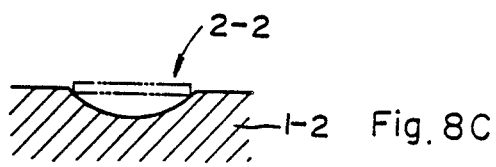
FIG. 8C is a sectional view showing a conventional susceptor provided with spot-faced portions each having a bottom constituted by a single curved surface.

FIG. 6A shows the roughness of the reverse sides of substrates in the first batch processed using a conventional susceptor after it had been cleaned by vapor-phase etching, and FIG. 6B shows those in the second batch. As will be clear from these figures, the irregularities in the reverse sides of the substrates in the first batch are on the order of 0.5 $\mu$m, which are substantially equal to those in the case of the present invention shown FIG. 5A, but the irregularities in the reverse sides of the substrates in the second batch are about 2.0 $\mu$m to 2.5 $\mu$m, that is, there is a steep increase in the irregularities. Accordingly, it is difficult to use the conventional susceptor for a continuous vapor-phase growth reaction and it must be subjected to vapor phase etching after every single reaction.

Thus, the susceptor for a vapor-phase growth system according to the present invention is provided with spot-faced portions each having a concentrical circular edge which defines a pair of inner and outer spaces at the inner and outer sides, respectively, of it, so that a substrate is supported by the circular ridge. Accordingly, the substrate is heated uniformly by means of the radiant heat from the susceptor and it is therefore possible to reduce the incidence of slip by a large margin. Since there is no abnormal growth on the reverse side of the periphery of the substrate, the product yield increases.

Although the present invention has been described through specific terms, it should be noted here that the described embodiment is not necessarily exclusive and that various changes and modifications may be imparted thereto without departing from the scope of the invention which is limited solely by the appended claims.

What is claimed is:

1. A susceptor for a vertical vapor-phase growth system designed to heat substrates by means of heat transferred and radiated from a susceptor heated to cause vapor-phase growth on said substrates, said susceptor comprising:

a spot-faced portion provided therein for mounting a substrate, said spot-faced portion having a concentrical circular ridge to define a pair of inner and outer spaces at the inner and outer sides, respectively, of said ridge, each of said inner and outer spaces having a concave bottom having a circular radial section, so that a substrate is supported by said circular ridge.

2. A susceptor according to claim 1, wherein said circular ridge is provided at a position corresponding to 0.6 to 0.9 times the radius of the substrate.

3. A susceptor according to claim 1, wherein the depth of the concave bottom of said inner space from the substrate supporting plane is in the range of from 25 μm to 150 μm.

4. A susceptor according to claim 1, wherein the depth of the concave bottom of said outer space from the substrate supporting plane is in the range of from 30 μm to 70 μm.

* * * * *